United States Patent
Choi et al.

(10) Patent No.: US 11,804,585 B2
(45) Date of Patent: Oct. 31, 2023

(54) LAMP USING SEMICONDUCTOR LIGHT-EMITTING DEVICE AND MANUFACTURING METHOD THEREOF

(71) Applicant: LG ELECTRONICS INC., Seoul (KR)

(72) Inventors: Bongseok Choi, Seoul (KR); Mingu Kang, Seoul (KR); Hooyoung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 120 days.

(21) Appl. No.: 17/042,867

(22) PCT Filed: Sep. 10, 2018

(86) PCT No.: PCT/KR2018/010534
§ 371 (c)(1),
(2) Date: Sep. 28, 2020

(87) PCT Pub. No.: WO2019/221339
PCT Pub. Date: Nov. 21, 2019

(65) Prior Publication Data
US 2021/0020818 A1    Jan. 21, 2021

(30) Foreign Application Priority Data
May 16, 2018 (KR) .................. 10-2018-0056131

(51) Int. Cl.
*H01L 33/62* (2010.01)
*F21S 43/14* (2018.01)
(Continued)

(52) U.S. Cl.
CPC ............ *H01L 33/62* (2013.01); *F21S 41/141* (2018.01); *F21S 43/14* (2018.01); *H01L 27/156* (2013.01);
(Continued)

(58) Field of Classification Search
CPC ..... H01L 33/62; H01L 27/156; H01L 33/005; H01L 33/382; H01L 33/44;
(Continued)

(56) References Cited

U.S. PATENT DOCUMENTS 9,620,695 B2    4/2017  Hu et al.
2009/0268459 A1  10/2009  Chang
(Continued)

FOREIGN PATENT DOCUMENTS

JP       2012-513673 A    6/2012
KR       10-1803874 B1   12/2017
(Continued)

OTHER PUBLICATIONS

Korean Office Action dated Nov. 22, 2022 for Application No. 10-2018-0056131 is provided.

*Primary Examiner* — Su C Kim
(74) *Attorney, Agent, or Firm* — Birch, Stewart, Kolasch & Birch, LLP

(57) ABSTRACT

Discussed is a lamp and a lamp device, and more particularly, to a lamp using a semiconductor light-emitting device, and a method of manufacturing the lamp. The lamp includes a substrate; a plurality of semiconductor light-emitting devices disposed on the substrate; a flat layer formed between the plurality of semiconductor light-emitting devices; a spacer disposed between the substrate and the flat layer; and an air gap disposed between each semiconductor light-emitting device and the spacer.

22 Claims, 6 Drawing Sheets

(51) Int. Cl.
*F21S 41/141* (2018.01)
*H01L 27/15* (2006.01)
*H01L 33/00* (2010.01)
*H01L 33/38* (2010.01)
*H01L 33/44* (2010.01)

(52) U.S. Cl.
CPC .......... *H01L 33/005* (2013.01); *H01L 33/382* (2013.01); *H01L 33/44* (2013.01); *H01L 2933/0016* (2013.01); *H01L 2933/0025* (2013.01); *H01L 2933/0066* (2013.01)

(58) Field of Classification Search
CPC ..... H01L 2933/0016; H01L 2933/0025; H01L 2933/0066; H01L 25/0753; H01L 33/54; H01L 33/58; H01L 2933/005; H01L 25/075; H01L 27/15; H01L 33/48; F21S 41/141; F21S 43/14; F21S 41/153; F21K 9/20; F21Y 2115/10
See application file for complete search history.

(56) References Cited

U.S. PATENT DOCUMENTS

| | | | |
|---|---|---|---|
| 2015/0362165 A1* | 12/2015 | Chu | H01L 27/156 362/235 |
| 2017/0133357 A1* | 5/2017 | Kuo | H01L 25/167 |
| 2017/0365755 A1* | 12/2017 | Chu | H01L 27/153 |
| 2018/0190712 A1* | 7/2018 | Xu | H01L 33/0012 |
| 2018/0198045 A1* | 7/2018 | Perzlmaier | H01L 33/60 |
| 2018/0311935 A1* | 11/2018 | Sahyou | B32B 17/10541 |

FOREIGN PATENT DOCUMENTS

| | | |
|---|---|---|
| KR | 10-2013-0043433 A | 9/2020 |
| WO | WO 2012/027616 A2 | 3/2012 |

\* cited by examiner

LAMP USING SEMICONDUCTOR LIGHT-EMITTING DEVICE AND MANUFACTURING METHOD THEREOF

CROSS REFERENCE TO RELATED APPLICATIONS

This application is the National Stage filing under 35 U.S.C. 371 of International Application No. PCT/KR2018/010534 filed on Sep. 10, 2018, which claims priority to Korean Patent Application No. 10-2018-0056131, filed in the Republic of Korea on May 16, 2018, the entire contents of all these applications are hereby expressly incorporated by reference into the present application.

TECHNICAL FIELD

The present disclosure relates to a lamp, and more particularly, a lamp using a semiconductor light-emitting device.

BACKGROUND

A vehicle or car is equipped with various lamps having lighting functions and signaling functions. In general, halogen lamps or gas discharge lamps have been usually used, but in recent years, light-emitting diodes (LEDs) are in the spotlight as light sources for automotive or vehicle lamps.

The LED can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light-emitting device of converting a current into light, namely, an image displaying light source used in an electronic device such as an information communication device.

However, automotive lamps developed to date use LEDs in the package form, which have disadvantages including a low mass production yield rate, high fabrication costs, and low flexibility.

Meanwhile, light proceeding downward to a semiconductor light-emitting device (or element) may cause a decrease in an amount or quantity of lamp light. For this reason, structures that can increase a light extraction rate of a lamp by reflecting light traveling downward to the semiconductor light-emitting device are being developed.

SUMMARY

The present disclosure describes a lamp capable of increasing an amount of lamp light by reflecting light traveling downward to a semiconductor light-emitting device.

According to one aspect of the subject matter described in this application, a lamp includes a substrate, a plurality of semiconductor light-emitting devices disposed on the substrate, a flat layer formed between the semiconductor light-emitting devices, and a spacer disposed between the substrate and the flat layer. An air gap may be formed between each semiconductor light-emitting device and the spacer.

Implementations according to this aspect may include one or more of the following features. For example, the air gap may surround a periphery of the semiconductor light-emitting devices.

In some implementations, a wiring electrode disposed on the substrate and a metal solder layer disposed between the wiring electrode and each semiconductor light-emitting device may be further provided. The air gap may be formed on the wiring electrode and surround a periphery of the metal solder layer.

In some implementations, a part of each of the semiconductor light-emitting devices may be surrounded by the flat layer, and another part thereof may be surrounded by the air gap.

In some implementations, each of the semiconductor light-emitting devices may be entirely surrounded by the flat layer, and the air gap may surround the metal solder layer.

In some implementations, the flat layer may include a first region that surrounds the semiconductor light-emitting devices and a second region that surrounds the first region. The air gap may be formed between the first region and the substrate.

In some implementations, the spacer may be provided at a boundary between the first region and the second region, and the second region may surround the spacer.

In some implementations, a glass layer formed in a periphery of the semiconductor light-emitting devices and disposed on the substrate may be further provided. The spacer may protrude from the glass layer in a thickness direction of the semiconductor light-emitting devices.

In some implementations, a part of the second region may be disposed on the glass layer.

According to another aspect of the subject matter described in this application, a method of manufacturing a lamp is provided. The method may include transferring semiconductor light-emitting devices, each having a chip guide formed in a periphery thereof, onto the wiring electrode, forming a coating layer by spin coating a glass-based resin on the substrate, curing the coating layer, forming a flat layer between the semiconductor light-emitting devices after curing the coating layer, and etching a portion of the flat layer to form an upper electrode. The transferring of the semiconductor light-emitting devices onto the wiring electrode may be performed to form a space between the chip guide and the substrate, and the forming of the coating layer may be performed to form the coating layer in the space.

According to the present disclosure, an air gap formed in a periphery of the semiconductor light-emitting device totally reflects light traveling downward to the semiconductor light-emitting device, thereby increasing a light extraction rate of the lamp.

Further, the air gap may be formed in the periphery of the semiconductor light-emitting device without a separate or additional process, allowing the light extraction rate of the lamp to be enhanced without increasing production costs.

DETAILED DESCRIPTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A lamp described in this specification may be applied to a vehicle. More specifically, a lamp disclosed herein may include a head lamp, a tail lamp, a position lamp, a fog lamp, a turn signal lamp, a stop (or brake) lamp, an emergency lamp, a backup lamp, and the like. For the sake of convenience, description will be given of an embodiment in which the lamp according to the present disclosure is applied to a vehicle, but the lamp according to the present disclosure may also be applied to any device requiring a lighting fixture or element besides the vehicle.

Figure 1:
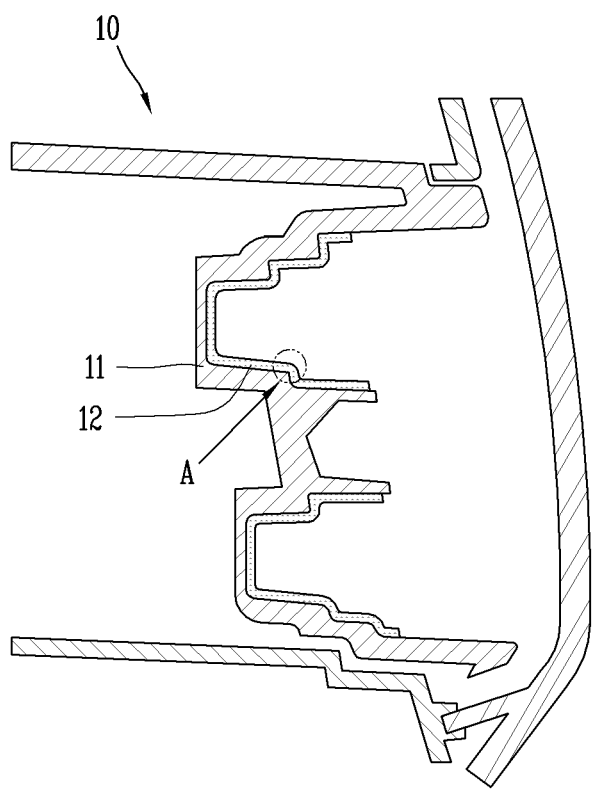
FIG. 1 is a conceptual view illustrating one example of a lamp using a semiconductor light-emitting device according to the present disclosure.

FIG. 1 is a conceptual view illustrating one embodiment of a lamp using a semiconductor light-emitting device according to the present disclosure.

A lamp 10 according to one exemplary embodiment of the present disclosure includes a frame 11 fixed to a vehicle body, and a light source unit 12 installed on the frame 11.

A wiring line for supplying power to the light source unit 12 may be connected to the frame 11, and the frame 11 may be fixed to the vehicle body directly, or by using a bracket. In some implementations, the lamp 10 may be provided with a lens unit to more diffuse and sharpen light emitted from the light source unit 12.

The light source unit 12 may be a flexible light source unit that can be curved, bent, twisted, folded, or rolled by an external force.

In a non-curved state of the light source unit 12 (e.g., a state having an infinite radius of curvature, hereinafter, referred to as a "first state"), the light source unit 12 is flat. When the first state is switched to a state that the light source unit 12 is bent by an external force (e.g., a state having a finite radius of curvature, hereinafter, referred to as a "second state"), the flexible light source unit may have a curved surface with at least part curved or bent.

A pixel of the light source unit 12 may be implemented by a semiconductor light-emitting device. The present disclosure exemplarily illustrates a light-emitting diode (LED) as a type of semiconductor light-emitting device for converting current into light. The LED may be a light-emitting device having a small size to thereby serve as a pixel even in the second state.

Meanwhile, the light source unit 12 according to the present disclosure includes a unit light source, a base substrate, and a connection electrode. Hereinafter, the above-mentioned constituent elements (components) will be described in detail.

The light source unit 12 may be provided with only the unit light source. Hereinafter, the unit light source will be described in detail regarding the light source unit 12 made up of only the unit light source.

Figure 2:
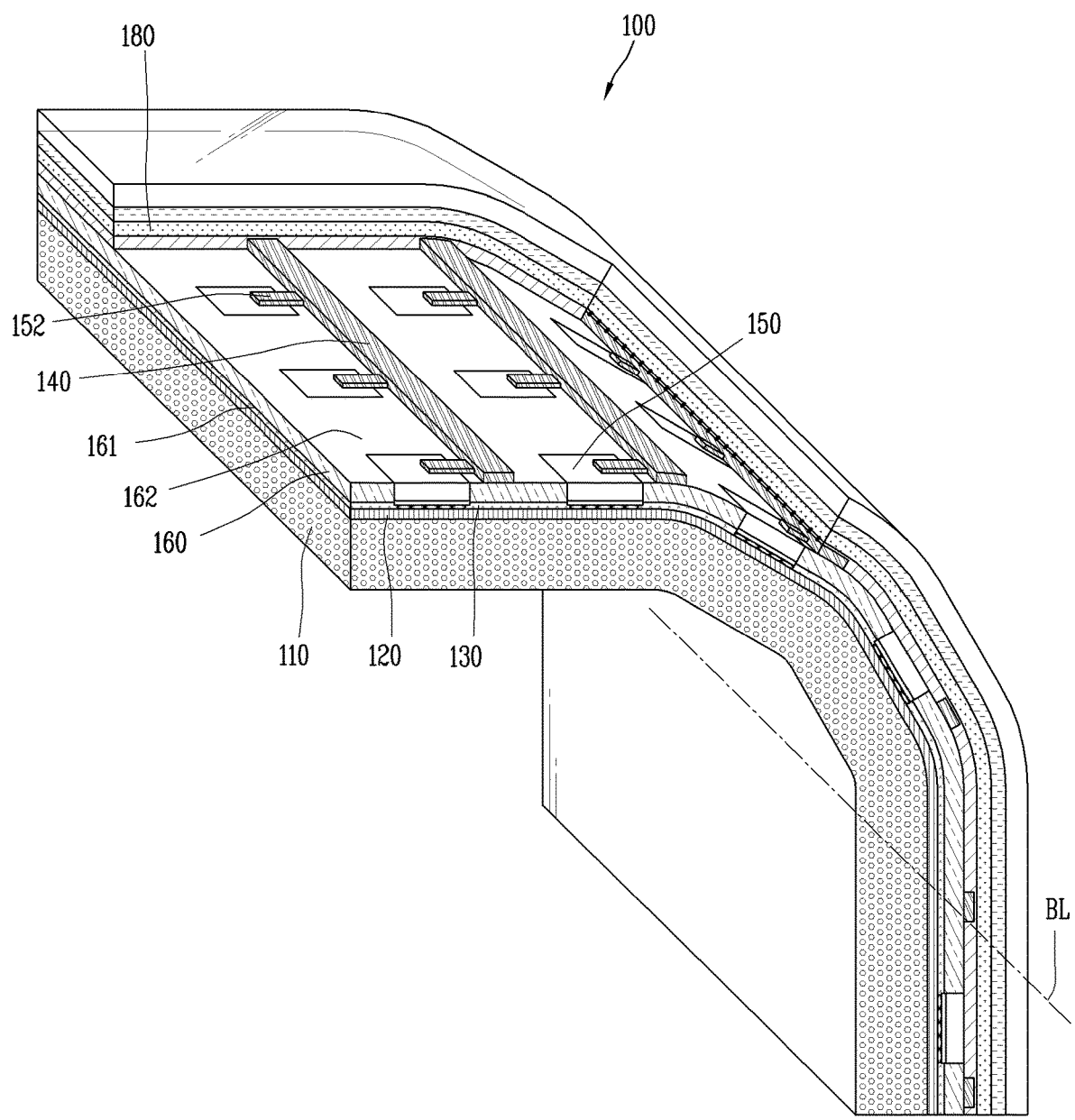
FIG. 2 is an enlarged view of a part "A" in FIG. 1.
Figure 3:
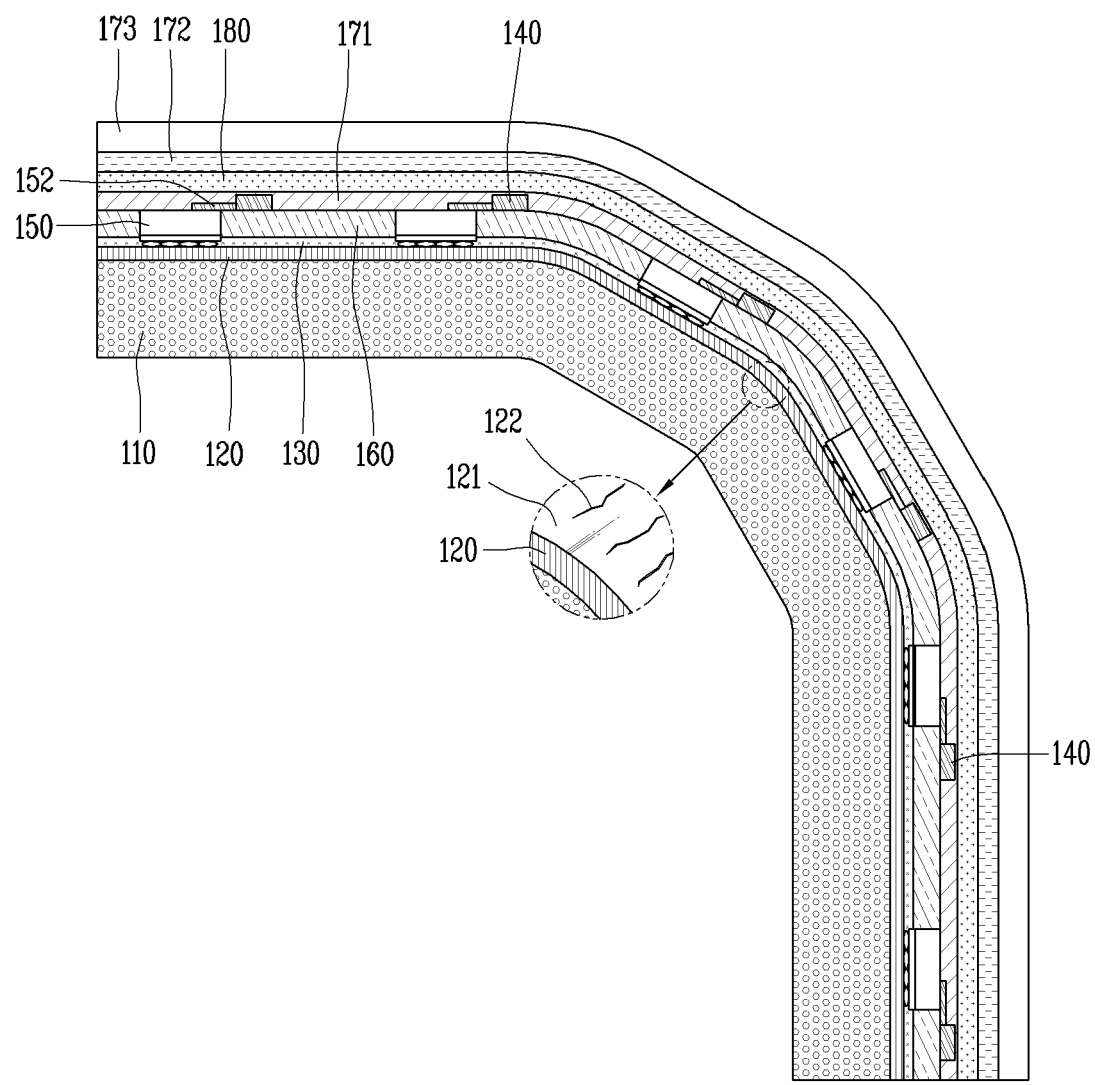
FIG. 3 is a cross-sectional view of the part "A" in FIG. 1.
Figure 4:
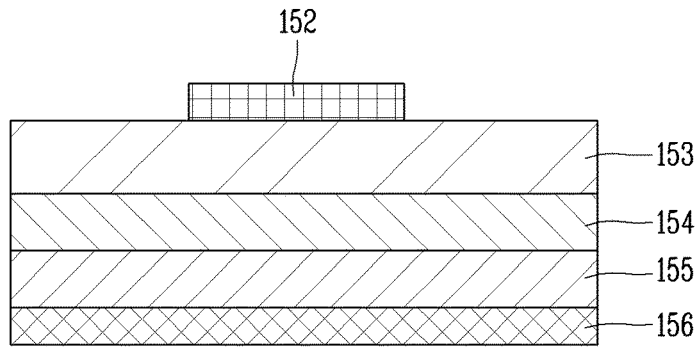
FIG. 4 is a conceptual view illustrating a vertical type semiconductor light-emitting device of FIG. 3.

FIG. 2 is a partially enlarged view of a part "A" in FIG. 1, FIG. 3 is a cross-sectional view of the part "A" in FIG. 1, and FIG. 4 is a conceptual view illustrating a vertical type semiconductor light-emitting device of FIG. 3.

Referring to FIGS. 2, 3 and 4, a passive matrix (PM) type semiconductor light-emitting device is used as a unit light source 100 using the semiconductor light-emitting device. However, an example described below may also be applicable to an active matrix (AM) type semiconductor light-emitting device.

The unit light source 100 may include a substrate 110, a first electrode 120, a first adhesive layer 130, a second electrode 140, and a plurality of semiconductor light-emitting devices 150.

The substrate 110 may be a base layer on which a structure is formed through an entire process, and may be a wiring substrate on which the first electrode 120 is disposed. The substrate 110 may be made of glass or polyimide (PI) to implement a flexible light source unit. Also, the substrate 110 may be made of a thin metal. The substrate 110 may alternatively be made of any material with insulating property and flexibility, for example, polyethylene naphthalate (PEN), polyethylene terephthalate (PET), and the like. Further, the substrate 110 may be either one of transparent and non-transparent materials.

Meanwhile, a heat dissipating sheet, a heat sink, or the like may be mounted on the substrate 110 to realize a heat dissipating function. In this case, the heat dissipating sheet, the heat sink, or the like may be mounted on an opposite surface of a surface on which the first electrode 120 is disposed.

The first electrode 120 is disposed on the substrate 110, and may be formed as a surface-shaped electrode. Therefore, the first electrode 120 may be an electrode layer disposed on the substrate, and may serve as a data electrode. In an implementation, an electrode pad that facilitates electrical connection with a connection electrode may be disposed on the first electrode. The first electrode 120 can include a non-irregular portion 121 and an irregular portion 122, such as a crack or a bump.

The first adhesive layer 130 is formed on the substrate 110 where the first electrode 120 is located.

The first adhesive layer 130 may be a layer having adhesiveness and conductivity, and to this end, a conductive material and an adhesive material may be mixed on the first adhesive layer 130. Therefore, the first adhesive layer 130 may be referred to as a "first conductive adhesive layer". Furthermore, the first adhesive layer 130 may have flexibility, thereby enabling a flexible function in the light source unit.

As an example, the first adhesive layer 130 may be an anisotropic conductive film (ACF), an anisotropic conductive paste, a solution containing conductive particles, and the like. The first adhesive layer 130 may be configured as a layer allowing an electrical interconnection in a Z-direction passing through its thickness, but having electric insulation in a horizontal X-Y direction. Accordingly, the first adhesive layer 130 may be referred to as a "Z-axis conductive layer".

The anisotropic conductive film is a film in which an anisotropic conductive medium is mixed with an insulating base member. When heat and pressure are applied, only a specific portion has conductivity by the anisotropic conductive medium. Hereinafter, a description will be given of an example that heat and pressure are applied to the anisotropic conductive film, but other methods may alternatively be used to allow the anisotropic conductive film to partially have conductivity. Examples of this method may be a method of applying any one of the heat and the pressure, a UV curing method, and the like.

In addition, the anisotropic conductive medium may be, for example, a conductive ball or a conductive particle. In this embodiment, the anisotropic conductive film is a film in which conductive balls are mixed with an insulating base member. When heat and pressure are applied, only a specific portion of the anisotropic conductive film obtains conductivity by the conductive balls. The anisotropic conductive film may be a state of containing a plurality of particles each of which a core of a conductive material is coated with an insulating film made of a polymer material. In this case, the insulating film of a portion to which heat and pressure have been applied is broken and thus obtains the conductivity by the core. At this time, the shape of the core may be deformed to form a layer brought into contact with each other in a thickness direction of the film. More specifically, heat and pressure are applied to the entire anisotropic conductive film, and an electrical connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed) and thus the portion has the conductivity in the thickness direction of the film. As another example, the conductive material may penetrate through the insulating base member in the Z-axial direction such that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is made of a material having adhesiveness, and the conductive balls are concentrated on a bottom portion of the insulating base member. When heat and pressure are applied to the base member, the base member is deformed together with the conductive balls so as to obtain conductivity in a perpendicular direction.

However, the present disclosure is not limited thereto. The anisotropic conductive film may alternatively be formed by randomly inserting conductive balls into the insulating base member, or may be configured in a form of double-ACF in which a plurality of layers is provided and the conductive balls are disposed in one of the layers.

The anisotropic conductive paste, which is a combination of a paste and conductive balls, may be a paste in which conductive balls are mixed with a base material having insulating property and adhesiveness. In addition, the solution containing conductive particles may be a solution in which conductive particles or nano particles are contained.

When an anisotropic conductive film is disposed in a state that the first electrode 120 is located on the substrate 110, heat and pressure are applied to connect the semiconductor light-emitting device 150 thereto, allowing the semiconductor light-emitting device 150 to be electrically connected to the first electrode 120. Here, the semiconductor light-emitting device 150 may be, preferably, disposed on the first electrode 120. Furthermore, as the anisotropic conductive film contains an adhesive component, the first adhesive layer 130 provides not only electrical connection, but also mechanical coupling between the semiconductor light-emitting device 150 and the first electrode 120.

As another example, the first adhesive layer 130 may be made of a tin-based alloy, Au, Al, Pb, or the like for eutectic bonding, and the substrate 110 and the semiconductor light-emitting device 150 may be joined together by eutectic bonding.

Since the semiconductor light-emitting device 150 has excellent luminance, it may constitute an individual unit pixel even though it has a small size. The size of the individual semiconductor light-emitting device 150 may be less than 80 μm of one side thereof, and may be a rectangular or square shaped device. Here, an area of the single semiconductor light-emitting device may be in the range of $10^{-10}$ to $10^{-5}$ m$^2$, and an interval or gap between the light-emitting devices may be in the range of 100 μm to 10 mm.

The semiconductor light-emitting device 150 may have a vertical structure.

A plurality of second electrodes 140 is located between the vertical type semiconductor light-emitting devices 150, and the plurality of second electrodes 140 is electrically connected to the semiconductor light-emitting devices 150, respectively.

Referring to FIG. 4, the vertical type semiconductor light-emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. Here, the p-type electrode 156 located at the bottom may be electrically connected to the first electrode 120 by the first adhesive layer 130, and the n-type electrode 152 located at the top may be electrically connected to the second electrode 140 which will be described hereinafter. Electrodes may be disposed in upper and lower positions in the vertical type semiconductor light-emitting device 150, thereby providing a great advantage of reducing the chip size.

Referring back to FIGS. 2 and 3, the plurality of semiconductor light-emitting devices 150 constitutes a light-emitting device array, and an insulating layer 160 is provided between the plurality of semiconductor light-emitting devices 150. For instance, the insulating layer 160 is formed on one surface of the first adhesive layer 130 to fill a space or gap between the semiconductor light-emitting devices 150. The insulating layer 160 includes a first surface 161 on the first adhesive layer 130 and a second surface 162 on the n-type electrode 152.

However, the present disclosure is not necessarily limited thereto, and alternatively employs a structure in which the first adhesive layer 130 fully fills the gap between the semiconductor light-emitting devices 150 without the insulating layer 160.

The insulating layer 160 may be a transparent insulating layer including silicon oxide (SiOx) or the like. As another example, the insulating layer 160 may be made of epoxy having excellent insulation properties and low light absorption, a polymer material such as methyl and phenyl-based silicone, or an inorganic material such as SiN, Al2O3, and the like, in order to prevent a short circuit between electrodes.

As illustrated, a phosphor layer 180 is provided at the light-emitting element array.

The phosphor layer 180 may be disposed on one surface of the semiconductor light-emitting device 150. For example, the semiconductor light-emitting device 150 may be a blue semiconductor light-emitting device 151 that emits blue (B) light, and the phosphor layer 180 for converting the blue (B) light into another color may be provided thereon. Here, the phosphor layer 180 may include a red phosphor capable of converting blue light into red (R) light, a green phosphor capable of converting blue light into green (G) light, or a yellow phosphor capable of converting blue light into white (W) light.

Here, the wavelength of light in a Nitride-based semiconductor light-emitting device has a range of 390 to 550 nm, which may be converted to 450 to 670 nm using a film in which a phosphor is inserted. Alternatively, the phosphor layer 180 may include all of the red phosphor and the green phosphor to mix light of various wavelengths so as to realize white light. As for a GaAs-based red semiconductor light-emitting device, a light diffusion film may be used to realize red-based light, instead of a phosphor. In addition, a patterned sheet may be inserted to improve light extraction efficiency. Further, a patterned sheet may be inserted to improve light extraction efficiency.

In this case, an optical gap layer 171 may be provided between the semiconductor light-emitting device 150 and the phosphor layer 180. The optical gap layer 171 may be made of a material having low light absorption and excellent bending properties such as epoxy and acrylic, or methyl-based silicone, phenyl-based silicone, and the like. In addition, in order to optimize light efficiency, a patterned sheet may be inserted, or particles having different refractive indices may be mixed.

At this time, a color filter 172 may also be stacked on the phosphor layer 180 to improve color purity of converted light. In addition, the color filter 172 may be covered by a protective layer 173 to protect the light source unit from moisture, oxygen, and external impact. Here, the protective layer 173 may be formed by bonding a film or coating resin.

A lamp according to an embodiment of the present disclosure includes a substrate 310, a plurality of semiconductor light-emitting devices 350, a flat layer 330, a spacer 371, and an air gap 380. Hereinafter, the above-described constituent elements (components) will be described in detail with reference to the accompanying drawings.

Figure 5:
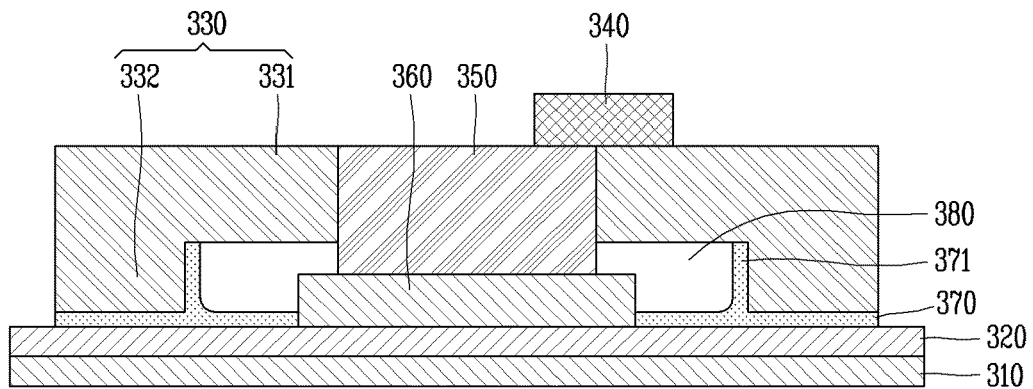
FIGS. 5 and 6 are cross-sectional views of a lamp according to the present disclosure.
Figure 6:
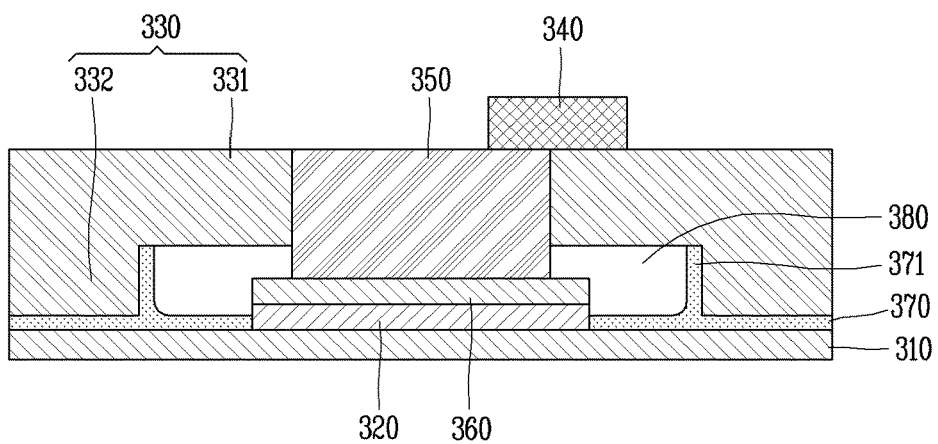

FIGS. 5 and 6 are cross-sectional views of a lamp according to the present disclosure.

The plurality of semiconductor light-emitting devices 350 is disposed on the substrate 310. In detail, a wiring electrode 320 that applies a voltage to the plurality of semiconductor light-emitting devices 350 is disposed on the substrate 310, and each of the semiconductor light-emitting devices 350 is electrically connected to the wiring electrode 320. In this embodiment of the present disclosure, a metal solder is used to electrically connect the semiconductor light-emitting devices 350 and the wiring electrode 320, instead of using the anisotropic conductive film described above. Accordingly, the wiring electrode 320 and a metal solder layer 360 are disposed between the semiconductor light-emitting device 350 and the substrate 310.

The flat (or planar) layer 330 is formed between the semiconductor light-emitting devices 350. The flat layer 330 may be made of a light-transmitting (or transmissive) resin. The flat layer 330 is formed to a height of the semiconductor light-emitting device 350. The flat layer 330 allows the phosphor layer, the color filter, and the like to be stably or securely stacked on the semiconductor light-emitting device 350. An upper electrode 340 is located on the semiconductor light-emitting device 350 and the flat layer 330.

The spacer 371 is provided between the flat layer 330 and the substrate 310. The spacer 371 is disposed on the substrate 310 or the wiring electrode 320 in a manner of surrounding a periphery of each semiconductor light-emitting device 350.

In detail, as illustrated in FIG. 5, the spacer 371 is provided on the wiring electrode 320 in an area (or region) through which the wiring electrode 320 passes. Or, as illustrated in FIG. 6, the spacer 371 is provided on the substrate 310 in an area through which the wiring electrode 320 does not pass.

Although not shown, the spacer 371 is only provided on the wiring electrode 320 in case the wiring electrode 320 is formed as a surface-shaped electrode.

Meanwhile, as the spacer 371 has a height lower than a height of each of the semiconductor light-emitting devices 350, the spacer 371 surrounds the metal solder layer 360 and a part of a lower portion of the semiconductor light-emitting device 350. In this case, the air gap 380 surrounds a part of a periphery of the semiconductor light-emitting device 350. Here, the air gap 380 may totally reflect part (or some) of light directed toward a side surface of the semiconductor light-emitting device 350 to thereby increase a light extraction rate of the lamp.

Although not shown, the spacer 371 may have the same height as the metal solder layer 360. In this case, the spacer 371 does not surround the circumference of the semiconductor light-emitting device 350.

The spacer 371 may be made of a Siloxane or Silica-based resin such as Spin on Glass.

Meanwhile, the flat layer 330 in the vicinity of the semiconductor light-emitting device 350 may be spaced apart from the substrate 310 and the wiring electrode 320 by a predetermined distance. Accordingly, a space is formed in the periphery of the semiconductor light-emitting device 350, which is the air gap 380 according to the present disclosure.

The spacer 371 is disposed in a space generated as the substrate 310, the wiring electrode 320, and the flat layer 330 are being spaced apart from one another. The air gap 380 is formed only between the spacer 371 and the semiconductor light-emitting device 350, and is not formed in an area other than the area surrounded by the spacer 371.

In order to more clearly describe a structure of the lamp according to the present disclosure, the flat layer 330 will be divided into two regions. Materials constituting the two regions are the same, and the two regions may be physically distinguished or virtually divided areas. In this specification, of an entire region of the flat layer 330, a region that surrounds the semiconductor light-emitting device 350 is referred to as a first region 331, and a region that surrounds the first region 331 is referred to as a second region 332.

The first region 331 may surround the periphery of the semiconductor light-emitting device 350. Here, the first region 331 is spaced apart from the substrate 310 and the wiring electrode 320 by a predetermined distance, and does not surround a periphery of the metal solder layer 360. Alternatively, the first region 331 may surround the entire periphery of the semiconductor light-emitting device 350, or may surround a part of the periphery of the semiconductor light-emitting device 350. The spacer 371 is provided between the first region 331 and the substrate 310, or between the first region 331 and the wiring electrode 320.

Meanwhile, the spacer 371 is provided at a boundary between the first region 331 and the second region 332. The second region 332 surrounds the spacer 371, and is not spaced apart from the substrate 310 and the wiring electrode 320. In more detail, the second region 332 is disposed to cover the wiring electrode 320 in the area where the wiring electrode 320 passes through, and the second region 332 is disposed to cover the substrate 310 in the area where the wiring electrode 320 does not pass through. Accordingly, an air gap is not formed between the second region 332, the substrate 310, and the wiring electrode 320.

Meanwhile, the lamp according to the present disclosure may be provided with a glass layer 370 formed in the periphery of the semiconductor light-emitting devices 350 and disposed on the substrate 310 and the wiring substrate 320. As illustrated in FIG. 5, the glass layer 370 is disposed to cover the wiring electrode 320 in the area where the wiring electrode 320 passes through. Or, as illustrated in FIG. 6, the glass layer 370 is disposed to cover the substrate 310 in the area where the wiring substrate 320 does not pass through.

The glass layer 370 may be formed up to an area in which the second region 332 is disposed. Accordingly, at least a part of the second region 332 may be formed on the glass layer 370.

The spacer 371 may protrude from the glass layer 370 in a thickness direction of the semiconductor light-emitting device 350. The spacer 371 and the glass layer 370 are made of the same material.

The glass layer 370 and the flat layer 330 are spaced apart from each other by a predetermined distance, and the air gap 380 is formed between the glass layer 370 and the flat layer 330.

In this structure, the air gap 380 is formed at a lower part of the semiconductor light-emitting device 350. As the air gap 380 totally reflects light proceeding or traveling downward to the light-emitting device 350 after being emitted therefrom, a light extraction rate of the lamp may be increased. In particular, unlike a metal reflective layer, the air gap 380 does not cause light loss due to light absorption, allowing the light extraction rate of the lamp to be drastically increased.

Meanwhile, the air gap 380 may be easily formed without adding a separate or additional process (step). Hereinafter, a manufacturing method for forming the air gap will be described in detail.

Figure 7:
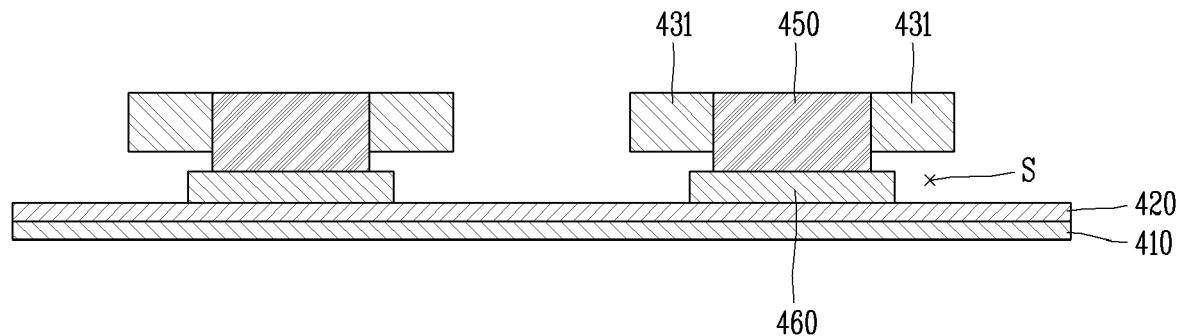
FIGS. 7 to 11 are conceptual views illustrating a method of manufacturing the lamp according to the present disclosure.
Figure 11:
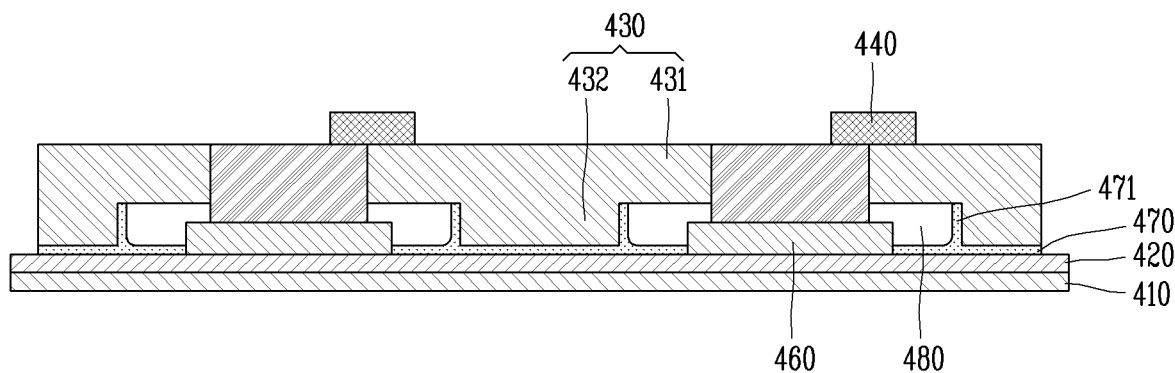

FIGS. 7 and 11 are conceptual views illustrating a method of manufacturing the lamp according to the present disclosure.

First, referring to FIG. 7, a wiring electrode 420 is disposed on a substrate 410, and semiconductor light-emitting devices 450 are transferred onto the wiring electrode 420.

The semiconductor light-emitting device 450 is fabricated in a wafer unit. The semiconductor light-emitting device 450 fabricated on a wafer is separated from the wafer to be transferred. A laser lift-off (LLO) or chemical lift-off (CLO) process or technique may be used for removing the semiconductor light-emitting device 450 from the wafer.

A chip guide 431 is provided in a periphery of the semiconductor light-emitting device 450 to prevent damage to the semiconductor light-emitting device 450 when separating the semiconductor light-emitting device 450 from the wafer. The chip guide 431 is made of a light-transmitting resin, and remains without being removed when the semiconductor light-emitting device 450 is transferred.

The chip guide 431 is designed to at least partially cover or surround the periphery of the semiconductor light-emitting device 450. More specifically, the chip guide 431 covers at least a part of the periphery of the semiconductor light-emitting device 450 when the semiconductor light-emitting device 450 is transferred onto the wiring electrode 420.

A metal solder layer 460 is formed between the semiconductor light-emitting device 450 and the wiring electrode 420, allowing the chip guide 431 and the wiring electrode 420 to be spaced apart from each other by a predetermined distance. In addition, in an area (or region) through which the wiring electrode 420 does not pass, the chip guide 431 and the substrate 410 are spaced apart from each other by a predetermined distance.

In this specification, a space (or gap) formed between the wiring electrode 420 and the chip guide 431 in an area where the wiring electrode 420 passes through, and a space formed between the substrate 410 and the chip guide 431 in the area where the wiring electrode 420 does not pass through are both referred to as a "space S".

Although the chip guide 431 entirely covers the periphery of the semiconductor light-emitting device 450, the chip guide 431, the wiring electrode 420, and the substrate 410 are spaced apart from one another by a predetermined distance due to the metal solder layer 460.

Figure 8:
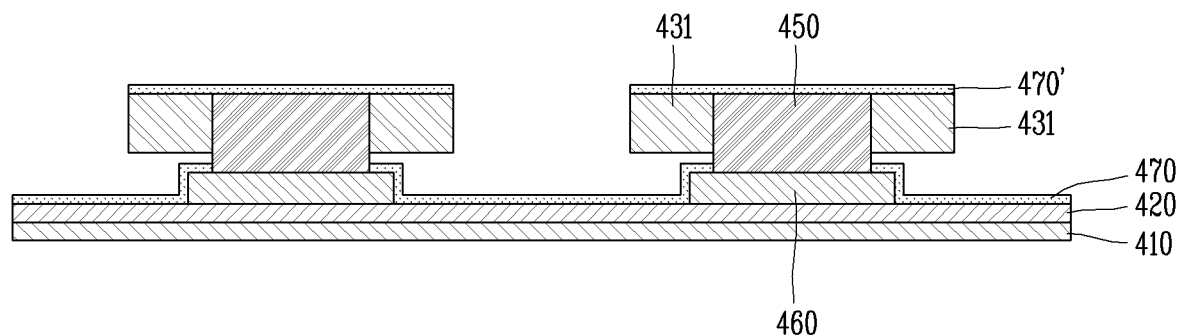

Next, as illustrated in FIG. 8, after transferring the semiconductor light-emitting device 450 onto the wiring electrode 420, a spin coating step is performed for depositing a glass-based resin thereon. Viscosity of the resin to be spin coated may be approximately 1 cp, but it is not limited thereto.

A thickness of a coating layer 470 formed by the spin coating is several hundred nm to 1 μm. The coating layer 470 is formed on an upper part of the semiconductor light-emitting device 450, a side surface of the chip guide 431, the wiring electrode 420, and the substrate 410. Here, the coating layer 470 is also formed in the space S.

Figure 9:
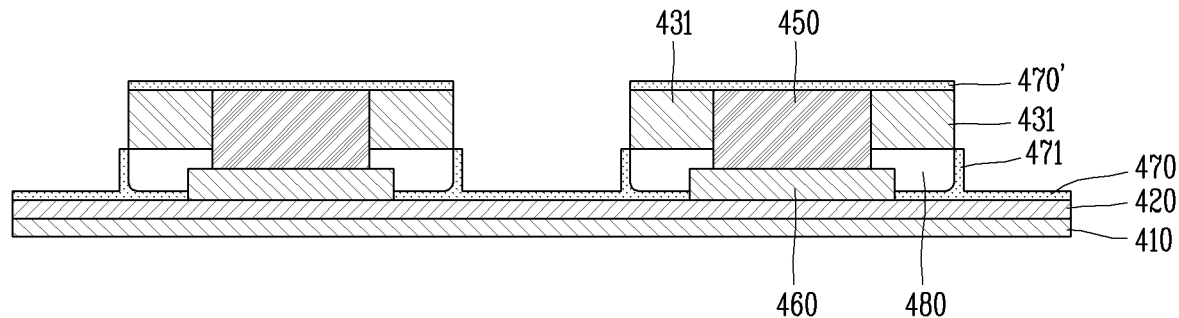

Next, as illustrated in FIG. 9, after the coating layer 470 is formed, a step of curing the coating layer is performed.

The coating layers 470 and 470' are cured at a temperature of 60 to 200° C. During the curing process, a solvent, such as Ethyl acetate and PGMEA, is evaporated. As a result, the thickness of the coating layers 470 and 470' is reduced to tens to several hundreds of nm.

Meanwhile, in the curing process, the coating layer 470 formed in the space S is cured while escaping (or flowing) to the outside. At this time, a spacer 471 is provided in the vicinity of the chip guide 431. A closed space is formed in the periphery of the semiconductor light-emitting device 450 by the spacer 471. The spacer 471 prevents an external material from flowing into the space S, and allows an air gap 480 to be formed in the periphery of the semiconductor light-emitting device 450.

Figure 10:
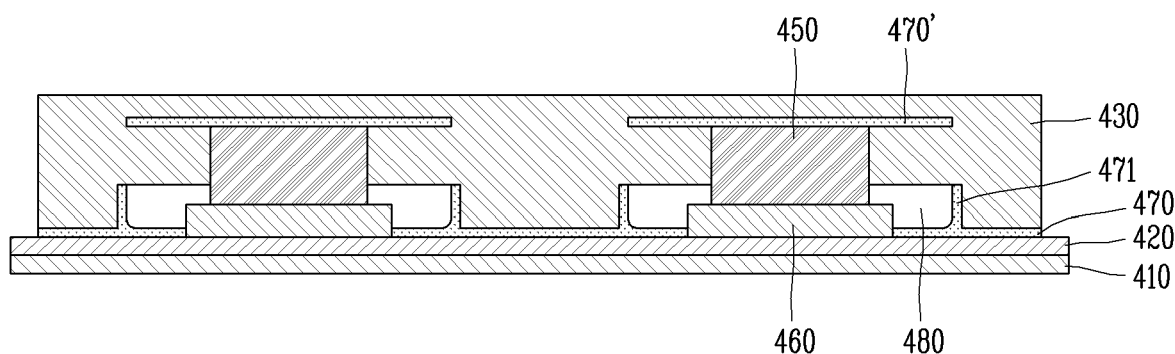

Next, as illustrated in FIG. 10, after curing the coating layer, a step of forming a flat layer 432 between the semiconductor light-emitting devices 450 is performed.

The flat layer 432 is made of the same material as the chip guide 431. Accordingly, the chip guide 431 and the flat layer 432 may not be physically divided. The first region 331 of the flat layer described in FIGS. 5 and 6 corresponds to the chip guide 431, and the second region 332 is the flat layer 432 formed in the current step.

Finally, as illustrated in FIG. 11, in order to form an upper electrode 440, a step of etching a portion of a flat layer 430 is performed. In this process, the coating layer 470' and the flat layer 430 covering the semiconductor light-emitting device 450 are removed. Therefore, the coating layer is disposed only on the substrate 410 or the wiring electrode 420.

With the manufacturing method, the air gap is formed during the coating process to improve insulation of the lamp. That is, the air gap may be formed without adding an air gap formation process separately.

The aforementioned lamp using the semiconductor light-emitting device is not limited to the configuration and the method of the embodiments described above, but the embodiments may be configured such that all or some of the embodiments are selectively combined so that various modifications can be made.

What is claimed is:

1. A lamp, comprising:
   a substrate;
   a wiring electrode disposed on the substrate;
   a plurality of semiconductor light-emitting devices disposed on the substrate;
   a metal solder layer disposed between the wiring electrode and each semiconductor light-emitting device;
   a flat layer formed between the plurality of semiconductor light-emitting devices;
   a spacer disposed between the substrate and the flat layer; and
   an air gap disposed between the each semiconductor light-emitting device and the spacer,
   wherein the spacer is spaced apart from the each semiconductor light-emitting device,
   wherein the air gap is directly in contact with a side surface of the each semiconductor light-emitting device, the metal solder layer, and a side surface of the spacer,
   wherein a topmost surface of the spacer is lower than a topmost surface of the plurality of semiconductor light-emitting devices, and
   wherein the air gap is disposed on the wiring electrode and surrounds a periphery of the metal solder layer.

2. The lamp of claim 1, wherein the air gap surrounds a periphery of the each semiconductor light-emitting device.

3. The lamp of claim 1, wherein a part of the each semiconductor light-emitting device is surrounded by the flat layer, and
   wherein another part of the each semiconductor light-emitting device is surrounded by the air gap.

4. The lamp of claim 1, wherein the each semiconductor light-emitting device is entirely surrounded by the flat layer.

5. The lamp of claim 1, wherein the flat layer comprises:
   a first region that surrounds the plurality of the semiconductor light-emitting devices; and
   a second region that surrounds the first region, and
   wherein the air gap is disposed between the first region and the substrate.

6. The lamp of claim 5, wherein the spacer is provided at a boundary between the first region and the second region, and
   wherein the second region surrounds the spacer.

7. The lamp of claim 6, further comprising a glass layer formed in a periphery of the plurality of semiconductor light-emitting devices and disposed on the substrate,
   wherein the spacer protrudes from the glass layer in a thickness direction of the plurality of semiconductor light-emitting devices.

8. The lamp of claim 7, wherein a material of the spacer is the same as that of the glass layer.

9. The lamp of claim 1, further comprising a chip guide disposed on the side surface of the each semiconductor light-emitting device, and the air gap is disposed below the chip guide.

10. The lamp of claim 1, wherein a topmost surface of the flat layer is substantially the same as the topmost surface of the plurality of semiconductor light-emitting devices, and
    wherein the topmost surface of the flat layer is higher than the topmost surface of the spacer.

11. The lamp of claim 1, wherein a lowest part of the air gap is lower than the lowest surface of the plurality of semiconductor light-emitting devices.

12. The lamp of claim 1, wherein a lowest surface of the flat layer is lower than a lowest surface of the plurality of semiconductor light-emitting devices.

13. A method of manufacturing a lamp, the method comprising:
    forming a wiring electrode on a substrate;
    transferring a plurality of semiconductor light-emitting devices onto the wiring electrode, each of the plurality of semiconductor light-emitting devices having a chip guide formed in a periphery thereof;
    forming a coating layer by spin coating a glass-based resin on the substrate;
    curing the coating layer;
    forming a flat layer between the plurality of semiconductor light-emitting devices after curing the coating layer; and
    etching a portion of the flat layer to form an upper electrode,
    wherein the transferring of the plurality of semiconductor light-emitting devices onto the wiring electrode is performed to form a space between the chip guide and the substrate, and
    wherein the forming of the coating layer is performed to form the coating layer in the space so as to form an air gap.

14. A lamp device, comprising:
    a plurality of semiconductor light-emitting devices disposed on a substrate;
    a wiring electrode disposed on the substrate;
    a light transmitting layer disposed between the plurality of semiconductor light-emitting devices, the light transmitting layer having a first portion that contacts the plurality of semiconductor light-emitting devices and a second portion that is spaced from the plurality of semiconductor light-emitting devices;
    a metal solder layer disposed between the wiring electrode and each semiconductor light-emitting device;
    a spacer interposed between the substrate and the light transmitting layer; and
    an air gap disposed between the second portion and the plurality of semiconductor light-emitting devices,
    wherein the spacer is spaced apart from the each semiconductor light-emitting device,
    wherein the air gap is directly in contact with a side surface of the each semiconductor light-emitting device, the metal solder layer, and a side surface of the spacer,
    wherein a topmost surface of the spacer is lower than a topmost surface of the plurality of semiconductor light-emitting devices, and
    wherein the air gap is disposed on the wiring electrode and surrounds a periphery of the metal solder layer.

15. The lamp device of claim 14, further comprising a glass layer extending on a surface of the substrate,
    wherein the spacer protrudes from the glass layer.

16. The lamp device of claim 15, wherein the spacer is located between the air gap and the light transmitting layer.

17. The lamp device of claim 14, wherein the air gap surrounds a periphery of the each semiconductor light-emitting device.

18. The lamp device of claim 14, wherein the each semiconductor light-emitting device is entirely surrounded by the light transmitting layer.

19. The lamp device of claim 14, wherein a portion of the plurality of the semiconductor light-emitting devices is exposed to the air gap.

20. The lamp device of claim 14, wherein a topmost surface of the light transmitting layer is substantially the same as the topmost surface of the plurality of semiconductor light-emitting devices, and
   wherein the topmost surface of the light transmitting layer is higher than the topmost surface of the spacer.

21. The lamp device of claim 14, wherein a lowest part of the air gap is lower than the lowest surface of the plurality of semiconductor light-emitting devices.

22. The lamp device of claim 14, wherein a lowest surface of the second portion is lower than a lowest surface of the plurality of semiconductor light-emitting devices.

* * * * *